(12) United States Patent
Erhart et al.

(10) Patent No.: US 12,362,445 B2
(45) Date of Patent: Jul. 15, 2025

(54) BATTERY SYSTEM WITH ADVANCED BATTERY DISCONNECTING UNIT

(71) Applicant: Samsung SDI Co., Ltd., Yongin-si (KR)

(72) Inventors: Michael Erhart, Yongin-si (KR); Joshua Hichens, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 17/446,935

(22) Filed: Sep. 3, 2021

(65) Prior Publication Data

US 2022/0077549 A1   Mar. 10, 2022

(30) Foreign Application Priority Data

Sep. 7, 2020   (EP) .................................... 20194891
Sep. 1, 2021   (KR) ........................ 10-2021-0116397

(51) Int. Cl.
*H01M 10/613* (2014.01)
*H01M 10/42* (2006.01)
(Continued)

(52) U.S. Cl.
CPC ....... *H01M 50/583* (2021.01); *H01M 10/425* (2013.01); *H01M 10/613* (2015.04); *H01M 10/6556* (2015.04); *H01M 10/6567* (2015.04); *H01M 50/507* (2021.01); *H05K 1/0254* (2013.01); *H05K 1/14* (2013.01);
(Continued)

(58) Field of Classification Search
CPC . H01M 10/60; H01M 10/425; H01M 10/4257
See application file for complete search history.

(56) References Cited

U.S. PATENT DOCUMENTS

2011/0206948 A1   8/2011   Asai et al.
2015/0072209 A1*  3/2015   Tyler ...................... B60L 15/20
                                                        429/159
(Continued)

FOREIGN PATENT DOCUMENTS

CN   102163702 A   8/2011
CN   108879026 A   11/2018
(Continued)

OTHER PUBLICATIONS

"On (Adverb, Preposition) American English Definition and Synonyms: Macmillan Dictionary." On (Adverb, Preposition) American English Definition and Synonyms | Macmillan Dictionary, https://www.macmillandictionary.com/us/dictionary/american/on. (Year: 2023).*

(Continued)

*Primary Examiner* — James Lee
(74) *Attorney, Agent, or Firm* — Lewis Roca Rothgerber Christie LLP

(57) ABSTRACT

A battery system includes: a high voltage (HV) system having a plurality of connected rechargeable battery cells; a battery disconnecting unit (BDU) comprising a carrier plate, BDU relays configured to switchably open or close a HV line of the HV system, wherein the HV line is at least partially integrated into the carrier plate, and a BDU control unit configured to control the BDU relays; and a liquid cooling plate on a first side of the carrier plate.

16 Claims, 5 Drawing Sheets

(51) Int. Cl.
  *H01M 10/6556* (2014.01)
  *H01M 10/6567* (2014.01)
  *H01M 50/507* (2021.01)
  *H01M 50/583* (2021.01)
  *H05K 1/02* (2006.01)
  *H05K 1/14* (2006.01)

(52) U.S. Cl.
  CPC ............... *H01M 2010/4271* (2013.01); *H01M 2220/20* (2013.01); *H05K 2201/10037* (2013.01); *H05K 2201/10181* (2013.01); *H05K 2201/10272* (2013.01)

(56) References Cited

U.S. PATENT DOCUMENTS

| | | |
|---|---|---|
| 2019/0067162 A1 | 2/2019 | Ing et al. |
| 2019/0214606 A1 | 7/2019 | Kurcik et al. |
| 2019/0273288 A1 | 9/2019 | Jaensch et al. |
| 2019/0318892 A1 | 10/2019 | Ikejiri et al. |
| 2020/0127350 A1* | 4/2020 | Lee ..................... H01M 10/613 |

FOREIGN PATENT DOCUMENTS

| | | |
|---|---|---|
| CN | 110021789 A | 7/2019 |
| CN | 110233137 A | 9/2019 |
| DE | 10 2009 035 458 A1 | 2/2011 |
| EP | 2 362 463 A2 | 8/2011 |

OTHER PUBLICATIONS

Extended European Search Report for corresponding European Application No. 20194891.6, dated Feb. 19, 2021, 8pp.
EPO European Office Action dated Dec. 8, 2023, issued in corresponding European Patent Application No. 20194891.6 (6 pages).
Chinese Office Action, with English translation, dated Dec. 27, 2023, issued in corresponding Chinese Patent Application No. 202111042069.7 (15 pages).

* cited by examiner

BATTERY SYSTEM WITH ADVANCED BATTERY DISCONNECTING UNIT

CROSS-REFERENCE TO RELATED APPLICATION

The present application claims priority to and the benefit of European Patent Application No. 20194891.6, filed in the European Patent Office on Sep. 7, 2020, and Korean Patent Application No. 10-2021-0116397 filed in the Korean Intellectual Property Office on Sep. 1, 2021, the entire content of each of which is incorporated herein by reference.

BACKGROUND

1. Field

Aspects of some embodiments of the present invention relate to a battery system having a relatively advanced battery disconnecting unit and to an electric vehicle including the same.

2. Description of Related Art

In the recent years, vehicles for transportation of goods and people have been developed using electric power as a source for motion. Such electric vehicles are automobiles that are propelled by electric motors, using energy stored in rechargeable batteries. An electric vehicle may be solely powered by batteries or may be a hybrid vehicle that may be at least partially or occasionally powered, for example, by a gasoline generator. Furthermore, the vehicle may include a combination of electric motor and a combustion engine. In general, an electric-vehicle battery, EVB, or traction battery is a battery used to power the propulsion of battery electric vehicles, BEVs. Electric-vehicle batteries differ from starting, lighting, and ignition batteries because they are designed to give power over sustained periods of time. A rechargeable or secondary battery differs from a primary battery in that it can be repeatedly charged and discharged, while the latter provides only an irreversible conversion of chemical to electrical energy. Low-capacity rechargeable batteries are generally used as power supply for small electronic devices, such as cellular phones, notebook computers and camcorders, while high-capacity rechargeable batteries are used as the power supply for hybrid vehicles and the like.

The above information disclosed in this Background section is only for enhancement of understanding of the background and therefore the information discussed in this Background section does not necessarily constitute prior art.

SUMMARY

According to some embodiments of the present disclosure, a battery system, includes: a high voltage (HV) system having a plurality of connected rechargeable battery cells; a battery disconnecting unit (BDU) including a carrier plate, BDU relays configured to switchably open or close a HV line of the HV system, wherein the HV line is at least partially integrated into the carrier plate, and a BDU control unit configured to control the BDU relays; and a liquid cooling plate on a first side of the carrier plate.

According to some embodiments, the liquid cooling plate includes a cavity configured to conduct a cooling liquid, and the first side of the carrier plate conforms to a shape of the liquid cooling plate.

According to some embodiments, the battery system further includes a low voltage (LV) system having an operating voltage lower than an operating voltage of the HV system, wherein the BDU control unit is integrate with the LV system.

According to some embodiments, the BDU further includes HV components, including the BDU relays, and low-voltage (LV) components, including the BDU control unit and wherein the HV components and the LV components of the BDU are on a second side of the carrier plate that is opposite to the first side of the carrier plate.

According to some embodiments, the HV-line includes a plurality of busbars that are at least partially integrated into the carrier plate.

According to some embodiments, the HV components of the BDU include a high voltage printed circuit board (HV-PCB) on the second side of the carrier plate, including a conductive layer connected to the HV-line, and the LV components of the BDU include a low voltage printed circuit board (LV-PCB), wherein the HV components and the LV components of the BDU are on the HV-PCB.

According to some embodiments, the HV-PCB includes a pre-charge trace-resistor and wherein the pre-charge trace resistor includes a conductive trace.

According to some embodiments, the HV-PCB further includes a shunt.

According to some embodiments, the LV-PCB includes a first contacting component and wherein the HV-PCB includes a second contacting component configured for receiving the first contacting component for establishing a data connection between the LV-PCB and the HV-PCB.

According to some embodiments, the HV-PCB include a plurality of busbar connection areas each exposing a portion of one of the plurality of busbars.

According to some embodiments, the BDU components include at least one pyrotechnic safety switch, at least one relay, and/or at least one melting fuse.

According to some embodiments, at least one relay and/or fuse is connecting two busbar connection areas to each other.

According to some embodiments, the HV-PCB further includes a plurality of data lines connecting the second contacting means and at least one mounting socket formed on the second side of the carrier plate.

According to some embodiments, the BDU includes a thermally conducting and electrically isolating interface material layer (TIM) between the liquid cooling plate and the carrier plate and/or between the carrier plate and the HV-PCB.

According to some embodiments, the battery system may be applied to or incorporated within an electric vehicle.

BRIEF DESCRIPTION OF THE DRAWINGS

Aspects of some embodiments will become apparent to those of ordinary skill in the art by describing in more detail aspects of some embodiments with reference to the attached drawings in which.

DETAILED DESCRIPTION

Figure 1:
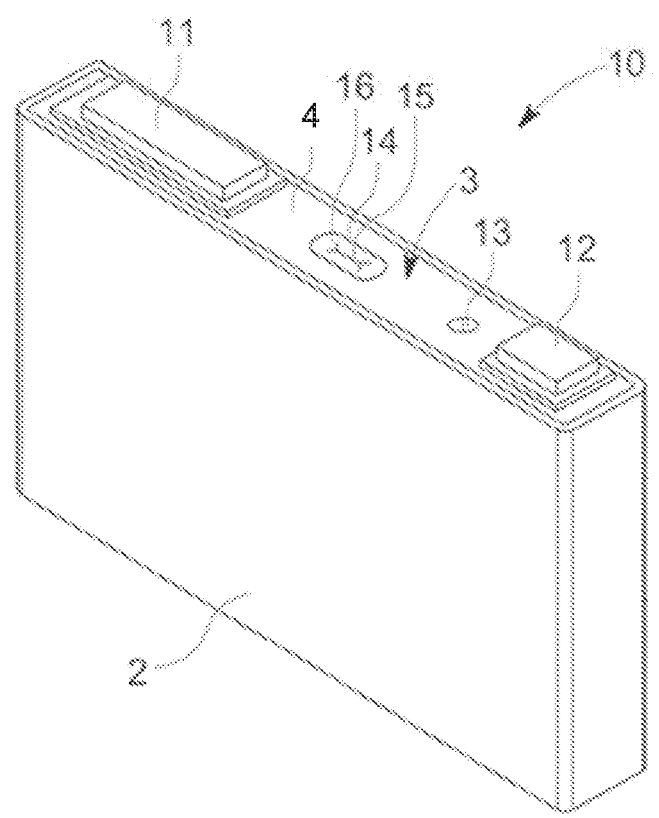
FIG. 1 illustrates a perspective view of a battery cell according to some embodiments.

While aspects of some embodiments of the present invention are open to various modifications and alternative embodiments, aspects of some embodiments thereof will be described and illustrated by way of example in the accompanying drawings. However, it should be understood that there is no intention to limit the present invention to the particular example embodiments disclosed, and, on the contrary, embodiments according to the present invention include all modifications, equivalents, and alternatives falling within the spirit and scope of embodiments according to the present invention.

Like numbers refer to like elements throughout the drawings. In the accompanying drawings, the sizes of structures may be exaggerated for clarity. Although the terms "first", "second", etc. are used herein to describe various elements, these elements should not be limited by these terms. The terms are used only for the purpose of distinguishing one element from another. For example, without departing from the scope of the present invention, a first element could be termed a second element, and similarly a second element could be also termed a first element. A single form of expression is meant to include multiple elements unless otherwise stated.

It will be understood that the terms "comprises" and/or "comprising," or "includes" and/or "including," when used in this specification, specify the presence of stated features, integers, steps, operations, elements, components, and/or combinations thereof but do not preclude the presence or addition of one or more other features, integers, steps, operations, elements, components, and/or combinations thereof. In addition, when a layer, a film, an area, or a plate is referred to as being "on" or "under" another layer, another film, another area, or another plate, it can be "directly" or "indirectly" on the other layer, film, area, plate, or one or more intervening layers may also be present. Further, in the present invention, when a part of a layer, a film, an area, a plate, and the like is formed on another part, a direction, in which the part is formed, is not limited only to an up direction, and includes a lateral direction or a down direction. On the contrary, it will be understood that when an element such as a layer, film, area, or plate is referred to as being "beneath" another element, it can be directly beneath the other element or intervening elements may also be present.

In the present application, when it is described that an element (such as a first element) is "operatively or communicatively coupled with/to" or "connected" to another element (such as a second element), the element can be directly connected to the other element or can be connected to the other element through another element (e.g., a third element). On the contrary, when it is described that an element (e.g., a first element) is "directly connected" or "directly coupled" to another element (e.g., a second element), it means that there is no intermediate element (e.g., a third element) between the element and the other element.

Hereinafter, aspects of some embodiments of the present invention will be described in more detail with reference to the accompanying drawings. In the following description, the singular forms "a," "an," and "the" are intended to include the plural forms as well, unless the context clearly indicates otherwise.

In general, rechargeable batteries include an electrode assembly including a positive electrode, a negative electrode, and a separator interposed between the positive and negative electrodes, a case receiving the electrode assembly, and an electrode terminal electrically connected to the electrode assembly. An electrolyte solution is injected into the case in order to enable charging and discharging of the battery via an electrochemical reaction of the positive electrode, the negative electrode, and the electrolyte solution. The shape of the case, e.g. cylindrical or rectangular, depends on the battery's intended purpose. Lithium-ion (and similar lithium polymer) batteries, widely known via their use in laptops and consumer electronics, dominate the most recent group of electric vehicles in development.

Rechargeable batteries may be used as a battery module formed of a plurality of unit battery cells coupled in series and/or in parallel so as to provide a high energy density, for example, for motor driving of a hybrid vehicle. That is, the battery module is formed by interconnecting the electrode terminals of the plurality of unit battery cells depending on a required amount of power and in order to realize a high-power rechargeable battery.

Battery modules can be constructed either in block design or in modular design. In block designs each battery is coupled to a common current collector structure and a common battery management system and the unit thereof is arranged in a housing. In modular designs, pluralities of battery cells are connected to form submodules and several submodules are connected to form the battery module. In automotive applications, battery systems often consist of a plurality of battery modules connected in series for providing a desired voltage. Therein, the battery modules may comprise submodules with a plurality of stacked battery cells, each stack comprising cells connected in parallel that are connected in series (XpYs) or multiple cells connected in series that are connected in parallel (XsYp).

A battery pack is a set of any number of (for example, identical or similar) battery modules. They may be configured in a series, parallel or a mixture of both to deliver the desired voltage, capacity, or power density. Components of battery packs include the individual battery modules, and the interconnects, which provide electrical conductivity between the battery modules.

For meeting the dynamic power demands of various electrical consumers connected to the battery system a static control of battery power output and charging is not sufficient. Thus, steady exchange of information between the battery system and the controllers of the electrical consumers is required. This information includes the battery systems actual state of charge, SoC, potential electrical performance, charging ability and internal resistance as well as actual or predicted power demands or surpluses of the consumers. Therefore, battery systems usually comprise a battery system manager, BSM, for obtaining and processing such information on system level and further a plurality of battery module managers, BMMs, which are part of the system's battery modules and obtain and process relevant information on system level. For example, the BSM usually measures the system voltage, the system current, the local temperature at different places inside the system housing, and the insulation resistance between live components and the system housing. Additionally, the BMMs usually measure individual the cell voltages and the temperatures of the battery modules.

In case of an abnormal operation state, a battery pack shall usually be disconnected from a load connected to a terminal of the battery pack. Therefore, battery systems further comprise a battery disconnect unit, BDU, that is electrically connected between the battery module and battery system terminals. Thus, the BDU is the primary interface between the battery pack and the electrical system of the vehicle. The BDU includes electromechanical switches that open or close high current paths between the battery pack and the electrical system. The BDU provides feedback to the battery control unit, BCU, accompanied to the battery modules such as voltage and current measurements. The BCU controls the switches in the BDU by using low current paths based on the feedback received from the BDU. The main functions of the BDU may thus include controlling current flow between the battery pack and the electrical system and current sensing. The BDU may further manage additional functions like external charging and pre-charging.

During the usage of the batteries the components of BDU get heated and release heat energy, hence, the components of the BDU need to be cooled. Usually, the BDU components are air cooled within the closed or partly opened housing inside the battery pack. This however, requires longer busbars to provide enough cooling surface for the electric components such as relay and fuses. The longer busbars require a much wider cross section of the busbars to keep the resistance and losses as low as possible. Furthermore, when realizing higher currents for fast charging much more power loss and internal heating of the BDU components is caused, for example, in the case of long and wide busbars.

It is thus an object of the present invention to overcome or reduce at least some of the drawbacks of the prior art and to provide a battery system that comprises an advanced layout of the BDU and its components, which allows for an improved cooling of the components of the BDU in an efficient manner.

Embodiments of the present disclosure seek to reduce or solve the problems existing in the prior art. For example, a battery system for a vehicle is provided, the battery system comprising a high voltage system, HV system, with a plurality of connected rechargeable battery cells. According to some embodiments, the plurality of connected rechargeable battery cells is used as at least one battery module formed of the plurality of battery cells coupled in series and/or in parallel. According to some embodiments, the at least one battery module may comprise submodules with a plurality of stacked rechargeable battery cells. In context of the present disclosure high voltage, HV, refers to a voltage sufficient for propelling power driving of an electric vehicle as usually provided by battery systems for electric vehicles. Exemplarily, the high voltage may be 48 V, 100 V, 300 V, or even more.

According to the present disclosure, the battery system further comprises a battery disconnecting unit, BDU, comprising a carrier plate and comprising BDU relays to switchably open or close a HV line of the HV system, wherein the HV line is at least partially integrated into the carrier plate and a BDU control unit adapted to control the BDU relays.

The HV line is the connection between the terminals of the plurality of connected rechargeable battery cells (or module terminals) and the terminals of the battery system, wherein the latter are configured to be contacted by external loads, such as e.g., a motor. The HV line may include a plurality of busbars. At least partially, the HV line is integrated into the carrier plate wherein the carrier plate comprises an electrically non-conductive material with a high melting point, for example, a melting point above 200° C., for example, above 300° C. and, according to some embodiments, above 350° C. According to some embodiments, the material has further a sufficient thermal conductivity, for example, a thermal conductivity above 0.1 W/(m*K), for example, above 1 W/(m*K) and according to some embodiments, above 5 W/(m*K). According to some embodiments, the insulating material is a plastic material and comprises a thermally conducting filler, such as in a ceramic or glass filled plastic material.

The BDU control unit is configured to control the relays in the BDU based on a control signal, which itself might be based on measurements of the battery system or may be received from a vehicle control unit (e.g., in case of a crash). The BDU control unit is thus configured to disconnect the plurality of battery cells from the battery system terminals in case of an abnormal operation state. In other words, the BDU is configured to selectively set the HV electric path between the battery cell/module terminals and the battery system terminals either conductive or non-conductive.

According to the present disclosure, the battery system further comprises a liquid cooling plate, wherein the liquid cooling plate is arranged on a first side of the carrier plate. The first side of the carrier plate may be a flat side of the carrier plate and the liquid cooling plate may be arranged on the first side such that a flat side of the liquid cooling plate contacts the first side. According to some embodiments, the flat side of the liquid cooling plate contacts the first side of the carrier plate in a thermally conductive manner such that the liquid cooling plate cools the carrier plate and thus the integrated parts of the HV line. The parts of the HV line that are integrated into the carrier plate may comprise the plurality of busbars.

The liquid cooling plate of the battery system may enable the use of much smaller busbars for the HV line, which lowers the resistance and losses of the BDU. Further, as the HV line is at least partially integrated into the carrier plate an electric and physical insulation between the busbars and the liquid cooling plate is improved and a risk for electric malfunctions due to leakage of cooling liquid is reduced. Furthermore, the battery system of the present disclosure has a reduced overall volume and weight compared to an alternative BDU of an alternative battery system. This may be achieved through the use of relatively smaller busbars, which is itself enabled by the use of more efficient cooling methods that is the liquid cooling plate. By more effectively cooling the BDU, the battery system may be used for relatively higher load applications, e.g., fast charging. In general, as the BDU elements, e.g. the busbars, are actively cooled by the liquid cooling plate in a highly efficient manner, higher loads can be applied to the battery system via the BDU.

According to another aspect of the present disclosure, the liquid cooling plate comprises a cavity that is configured to conduct a cooling liquid. The cavity may be, for example, a closed cavity within the liquid cooling plate that fluidly connects a coolant inlet and a coolant outlet of the liquid cooling plate. In other words, a coolant introduced into the cavity via the coolant inlet can flow through the cavity towards the coolant outlet and can be discharged from the cavity via the coolant outlet.

According to some embodiments, the liquid cooling plate is adapted such that the first side of the carrier plate form-fits on the liquid cooling plate. In other words, the first side of the liquid cooling plate and the first side of the carrier plate are shaped to fit together. The cavity of the liquid cooling plate may form at least one, but according to some embodiments, a plurality of, flow channel(s) for the cooling liquid. According to some embodiments, the cooling liquid may be water. According to some embodiments, the cooling liquid may be another suitable liquid cooling medium. According to some embodiments, the liquid cooling plate may be part of a cooling system of the battery system. According to some embodiments, the liquid cooling plate may be autonomous.

According to some embodiments of the battery system, the battery system further comprises a low voltage system, LV system, with an operating voltage lower than an operating voltage of the HV system, wherein the BDU control unit is assembled with the LV system. In other words, the BDU control unit receives its supply power from the LV system. Exemplarily, the LV operating voltage may be 12 V or another voltage used from a low voltage system of the battery system and/or the vehicle. According to some embodiments, the LV system further comprises a battery system manager, BSM, of the battery system and a plurality of sensors. In other words, the LV system of the battery system is designed to monitor the status of the battery system, e.g. by measuring the system voltage, the system current and/or the local temperature at different places inside the battery system, to process the measured data and send signals to battery components based on the processed data. For example in case of an abnormal operation state of the battery system, the LV system is able to detect the abnormalities in the measured data and to send a signal to the BDU relays, with the BDU control unit, to disconnect the HV line. According to some embodiments, the BSM is configured to communicate with external control units, such as vehicle control units, e.g., to receive a disconnect request signal from an external control unit and, in response to a received disconnect request signal, to send a disconnect signal to set BDU relays non-conductive.

According to some embodiments, the BDU further comprises high-voltage, HV, components, including for example the BDU relays, and low-voltage, LV, components, including for example the BDU control unit. According to the invention, the HV components and the LV components of the BDU are arranged on a second side of the carrier plate, wherein the second side of the carrier plate is opposite to the first side of the carrier plate.

According to some embodiments, the HV components and the LV components of the BDU are integrated and/or fixed to the second side of the carrier plate. By mounting the HV and LV components of the BDU to the second side of the carrier plate, the components also get cooled by the liquid cooling plate because of the material of the carrier plate with sufficient thermal conductivity. The inventive cooling of the LV components and especially the HV components of the BDU, such as relays, may enable relatively improved lifetime of the BDU components. For example, the HV components and/or LV components are configured as SMDs.

According to some embodiments, the HV-line comprises a plurality of busbars, wherein the busbars are at least partially integrated into the carrier plate. A busbar is a strip or bar for local high current power distribution. According to some embodiments, the plurality of busbars is made of metal. According to some embodiments, the busbars comprise a stamped grid copper. However, the busbars may also be formed from aluminum or a suitable alloy.

According to some embodiments, the HV components of the BDU comprise a high voltage printed circuit board, HV-PCB disposed on the second side of the carrier plate, including a conductive layer connected to the HV-line, and the LV components of the BDU comprise a low voltage printed circuit board, LV-PCB, wherein the HV components and the LV components of the BDU are disposed on the HV-PCB. According to some embodiments, the HV-PCB is at least partially integrated into the carrier plate. Alternatively according to some embodiments, the HV-PCB comprises a first side and an opposite second side, wherein the first side of the HV-PCB is disposed on the second side of the carrier plate and the HV components and the LV components of the BDU are disposed on the second side of the HV-PCB. In other words, according to some embodiments, the HV-PCB and the carrier plate are two different components that are arranged on top of each other but not integrated into each other.

The HV-PCB may be configured to replace a HV wiring harness, which may be utilized in related systems. In other words, the HV-PCB provides the electric connections between the HV-line (also at least partially integrated in the carrier plate) and the BDU control unit, e.g., for performing measurements, in an integrated manner. The BDU according to some embodiments may be a fully integrated HV component for conducting a HV between the battery cells and system terminals and for allowing measurement access to the HV line. Such measurement access may be provided by the at least one conductive layer.

Thus, embodiments according to the present disclosure may provide a relatively simple battery assembly or battery system. By using a HV-PCB instead of a HV wiring harness, the number of parts may be relatively reduced. Furthermore, the removal of a wiring harness may simplify the assembly process, as wiring harnesses may not otherwise be suitable for automated assembly.

According to some embodiments, the HV-PCB further comprises a pre-charge trace-resistor and the pre-charge trace resistor comprises a conductive trace. The conductive trace may also be formed by a conductive layer of the HV-PCB. By using a pre-charge trace resistor on the PCB, the invention replaces one or many off-the-shelf pre-charge resistor products and thus may further simplify the assembly process. In other words, the conductive layer of the HV-PCB may not only provide measurement access to the HV-line but may even form electric components required to perform pre-charging of the battery modules. The HV-PCB may further comprise other conductive traces, e.g., for forming an integrated shunt resistor or voltage divider.

According to some embodiments, the HV-PCB further comprises a shunt. In the battery system of the present disclosure there is active cooling of the shunt, may enable relatively increased accuracy for the current measurement, as the temperature of the shunt can be regulated using active cooling which may reduce or minimize the error.

According to some embodiments, the LV-PCB comprises first contacting means and the HV-PCB comprises second contacting means configured for receiving the first contacting means for establishing a data connection between the LV-PCB and the HV-PCB. According to some embodiments, the second contacting means are some kind of socket and the first contacting means a corresponding kind of plug that fits into the socket or vice versa. In other words, the contacting means are the two parts of a PCB connector, such as e.g., a Peripheral Component Interconnect Express, PCIe. In this aspect of the present disclosure, the HV-PCB is utilized like a high-voltage-motherboard and the LV-PCB may be mounted to the HV-PCB via a plug connection, which may simplify the assembly process and an eventual replacement of the LV-PCB.

According to another aspect of the present disclosure, the HV-PCB comprises busbar connection areas, wherein each busbar connection area exposes a portion of one of the plurality of busbars. The busbar connection areas may be formed as openings of the HV-PCB, e.g., for partially exposing busbars that are integrated (embedded) into the carrier plate. Advantageously, BDU components that are configured to be integrated into the HV line, like fuses or relays, can be simply connected between two busbars by being applied onto the busbar connection areas, i.e., two busbar connection areas. Hence, also in this respect the HV-PCB is utilized like a high-voltage-motherboard, which may simplify the assembly process and an eventual replacement of busbar connecting BDU components, such as relays or fuses, which can be mounted to the HV-PCB via a plug connection. According to some embodiments, the busbar connection areas expose a portion of a busbar that is configured for receiving a connection element of a BDU component.

According to some embodiments, the BDU components comprise at least one Pyrofuse, at least one relay and/or melting fuse. A pyrofuse is a pyrotechnic, fast-acting safety switch, which provides rapid battery isolation and is also called pyrotechnical safety switch, PSS. Aspects of some embodiments may utilize a PSS to replace at least one melting safety switch used in related systems. The at least one PSS, relay and/or melting fuse may be surface mounted to the HV-PCB. According to some embodiments, at least one relay and/or fuse is surface mounted to the HV-PCB such as to connect two busbar connection areas to each other. The busbars are a part of the HV line of the battery system that connects the terminals of the plurality of connected rechargeable battery cells with the battery system terminals. By connecting two busbar connection areas with at least one relay and/or fuse it is ensured, that in case of an abnormal operation state of the battery system, the HV line and thus the connection between the battery cells and the battery system terminal is disconnected.

According to some embodiments, the HV-PCB further comprises a plurality of data lines connecting the second contacting means and at least one mounting socket formed on the second side of the carrier plate. According to some embodiments, the at least one mounting socket is configured to receive a HV component of the BDU, such as a switchable relay or the like, which is controlled by the LV component of the BDU, such as the BDU control unit. The data lines can thus provide an electric connection between the BDU control unit, e.g., formed on the LV-PCB connected to the second contacting means, and the HV BDU components connected to the mounting sockets. According to some embodiments, the mounting sockets are disposed adjacent at least one busbar connection area, e.g. in order to allow a relay to be connected to the data lines for receiving switching signals and to the HV line for setting its conductivity.

According to some embodiments, at least one sensor may be mounted to a mounting socket of the HV-PCB. Hence, a LV-PCB connected with its first contacting means to the second contacting means is able to receive data like current, voltage or temperature data from the at least one sensor via respective mounting sockets and data lines. With the received data a connected LV-PCB is able to monitor the status of the BDU, for example, the status of the BDU component connected to the mounting socket.

According to some embodiments of the present disclosure, the BDU further comprises a thermally conducting and electrically isolating interface material layer arranged between the liquid cooling plate and the carrier plate and/or between the carrier plate and the HV-PCB. A thermally conductive and electrically insulating thermal interface material layer, TIM, has a high thermal conductivity but low electrical conductivity. This situation may occur when in insulators with low electrical conductivity, atomic vibrations of the phonons are very efficient at transporting heat. This is because heat is carried by both phonons and electrons, while free electrons are required for high electrical conductivity. According to some embodiments, the TIM has a thermal conductivity above 0.1 W/(m*K), for example, above 0.5 W/(m*K) and according to some embodiments, above 1 W/(m*K). Materials like polymorphs of boron nitride and silicon carbide, aluminum nitride or aluminum nitride layer sandwiched between two copper layers may be used as TIM. However, other materials, which could be used as TIM, may be used by a person skilled in the art.

According to some embodiments of the present disclosure, a vehicle including a battery module of the present disclosure as defined above is provided. Some embodiments of the vehicle correspond to aspects of embodiments of the battery module as also described above.

Further aspects of the present disclosure could be learned from the dependent claims or the following descriptions of the drawings.

FIG. 1 is a perspective view illustrating a battery cell according to some embodiments.

As shown in FIG. 1, a battery cell 10 according to some embodiments may include an electrode assembly, and a case 2 for accommodating the electrode assembly, the case 2 containing an electrolyte. The electrolyte may comprise a lithium salt, such as LiPF6 or LiBF4, and an organic solvent, such as EC, PC, DEC, or EMC. The electrolyte may be in a liquid, solid, or a gel state. The battery cell 10 may also include a cap assembly 3 for sealing an opening of the case 2. The battery cell 10 will be described as a non-limiting example of a lithium ion secondary battery configured to have a prismatic shape.

The case 2 may be configured to have a substantially cuboidal shape to form a space for accommodating the electrode assembly, and an opening may be formed at one side of the case 2. The case 2 may be formed of a metal, such as aluminum. The cap assembly 3 may include a cap plate 4 for covering the opening of the case 2 by being bonded to the case 2, and may include a positive terminal 11 (first terminal) and a negative terminal 12 (second terminal), which are externally protruded from the cap plate 4 to be electrically connected to the positive electrode and the negative electrode, respectively. The cap plate 4 may include an injection hole 13 and a vent hole 14 that communicate with an interior of the cap assembly 3. The injection hole 13 may be configured to allow injection of the electrolyte, and a sealing cap may be mounted thereon or therein. Further, a vent member 16 including a notch 15, which may be opened due to a pressure (e.g., a set or predetermined pressure), may be mounted to or in the vent hole 14.

Figure 2:
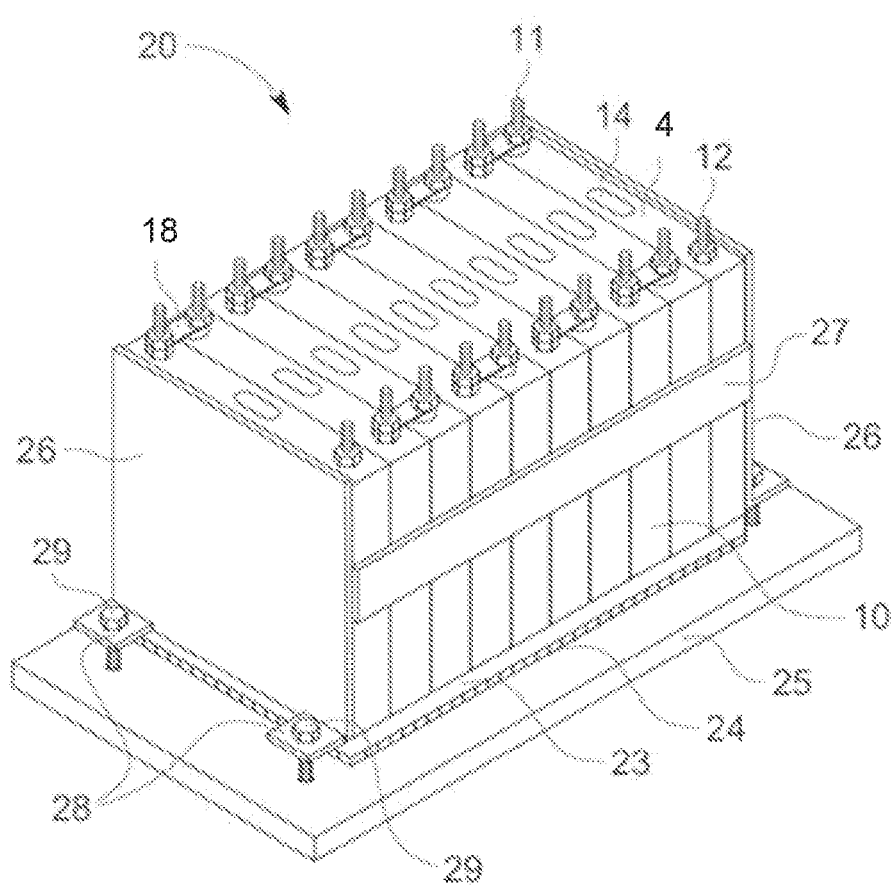
FIG. 2 illustrates a perspective view of a battery module.

Referring to FIG. 2, a battery module 20 according to some embodiments includes a plurality of battery cells 10, e.g. as illustrated in FIG. 1, aligned in one direction and a heat exchange member 23 provided adjacent to a bottom surface of the plurality of battery cells 10. In addition, an elastic member 24 made of rubber or other elastic materials may be interposed between a support plate 25 and the heat exchange member 23. A pair of end plates 26 are arranged to face wide surfaces of the battery cells 10 at the outside of the battery cells 10, and a connection plate 27 is configured to connect the pair of end plates 26 to each other thereby fixing the plurality of battery cells 10 together. Fastening portions 28 on both sides of the battery module 20 are fastened to the support plate 25 by bolts 29.

In the battery module 20, each battery cell 10 is a prismatic (or rectangular) cell, the wide flat surfaces of the cells 10 being stacked together to form the battery module 20. The positive and negative electrode terminals 11 and 12 of neighboring battery cells 10 are electrically connected through a battery module busbar 18, and the busbar 18 may be fixed by a nut or the like. Hence, the battery module 20 may be used as power source unit by electrically connecting the plurality of battery cells 10 as one bundle.

Figure 3:
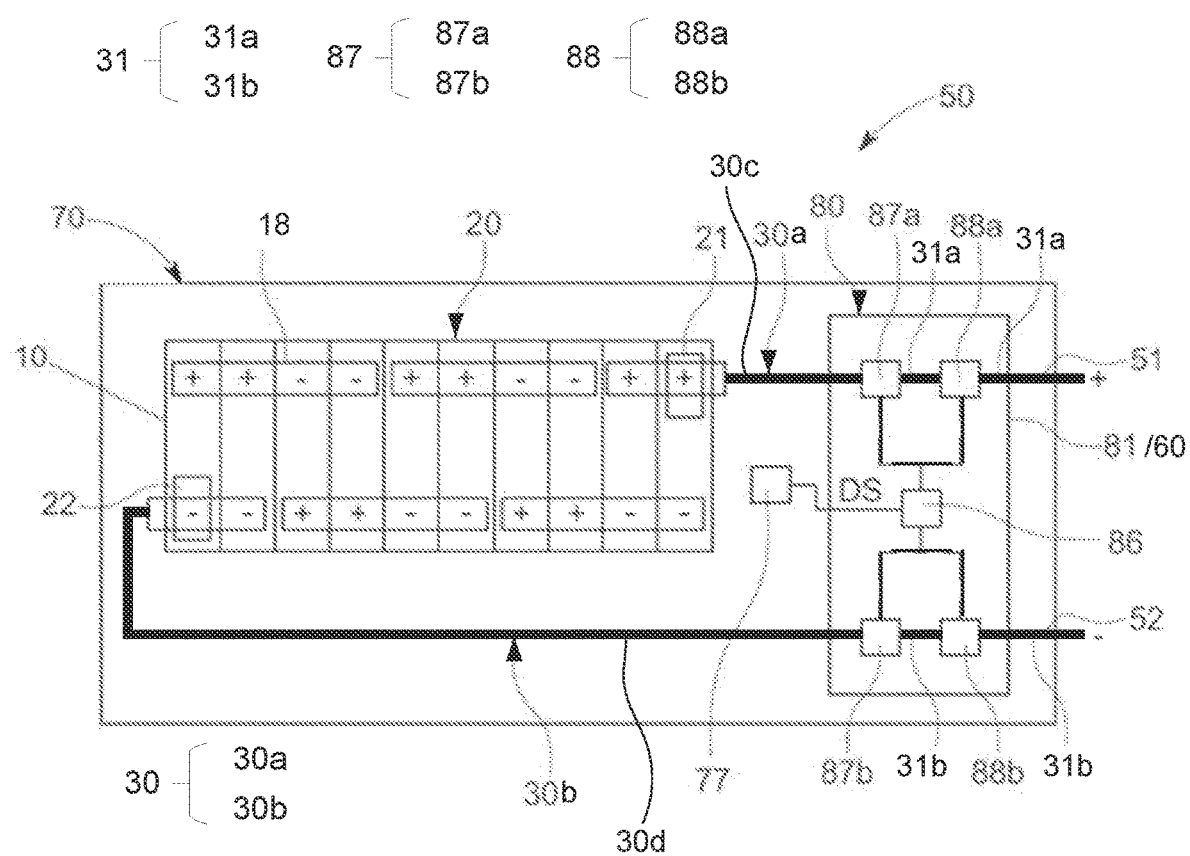
FIG. 3 illustrates a schematic top view of a battery system according to some embodiments.

FIG. 3 is a top view illustrating a battery system 50 according to some embodiments.

It is to be noted, that the FIG. 3 is meant to illustrate a better understandability of the battery system 50 of the present disclosure, especially the electrical connection between a battery module 20 and a BDU (Battery Disconnect Unit) 80 of the battery system 50. The battery system 50 may be utilized in an electric vehicle and thus the battery system 50 may only have a single level.

The battery system 50 comprises the battery module 20. As shown in FIG. 3, the battery module 20 comprises ten aligned battery cells 10 that are stacked in a stacking direction with their wide side surfaces facing each other. The plurality of battery cells 10 are interconnected by means of the respective busbars 18 between module terminals 21 and 22, namely a first module terminal 21 and a second module terminal 22.

The battery system 50 further comprises the BDU (Battery Disconnect Unit) 80 comprising a carrier plate 81 with a liquid cooling plate 60 underneath it. Furthermore, the BDU 80 comprises BDU elements. The BDU elements comprise a BDU control unit 86, two BDU relays 87, namely, a first BDU relay 87a and a second BDU relay 87b, two BDU fuses 88, namely, a first BDU fuse 88a and a second BDU fuse 88b, and a plurality of BDU busbars 31, namely, first BDU busbars 31a and second busbars 31b. The BDU control unit 86 is configured to control the BDU relays 87a and 87b, for example to set a conductivity of the BDU relays 87a and 87b. The BDU control unit 86 is further configured to control the BDU fuses 88a and 88b, for example, to monitor a state of the BDU fuses 88a and 88b.

According to some embodiments, the BDU control unit 86 may be configured to receive a signal indicative of a malfunction of the battery system 50 and/or indicating that disconnecting the at least one battery module 20 from a load is required and, in response to receiving such signal, is configured to control the further BDU elements, such as the BDU relays 87a and 87b and BDU fuses 88a and 88b, to disconnect the at least one battery module 20 from the respective system terminal (and consequently a downstream load). The functions of such components as part of a BDU are known to the skilled person. Furthermore, it is to be understood, that the presented BDU elements are not limited to the number of BDU relays and BDU fuses, as a person skilled in the art could use any other number of BDU relays and BDU fuses, for example, only one BDU fuse instead of two.

The first module terminal 21 of the battery module 20 is connected to a first (positive) battery system terminal 51 of the battery system 50 via a first HV line 30a of a HV line comprising a first high current cable 30c and the first BDU busbars 31a, the first BDU relay 87a and the first BDU fuse 88a. The second module terminal 22 of the battery module 20 is connected to a second (negative) battery system terminal 52 of the battery system 50 via a second HV line 30b of the HV line comprising a second high current cable 30d and the second BDU busbars 31b, the second BDU relay 87b and the second BDU fuse 88b. A high current path is formed by the HV line 30, comprising the BDU busbars 31a, 31b, and the battery module busbars 18 and is presented in FIG. 3 with thick lines. The HV line 30 and the BDU busbars 31a, 31b connect the module terminals 21, 22 of the battery module 20 of the battery system 50 with system terminals 51, 52, respectively, wherein these connections are provided via the BDU relays 87a and 87b and BDU fuses 88a and 88b, respectively.

The battery system 50 may further comprise a battery system manager, BSM, 77 located inside a housing 70 of the battery system 50 as shown in FIG. 3. The BSM 77 is configured to monitor the whole battery system 50, e.g. by measuring system voltage, system current, local temperature at different places inside the housing 70, and the insulation resistance between live components and the housing 70. The BSM 77 may determine the presence of an abnormal condition in the battery system 50 and perform or control to perform at least one countermeasure associated with the determined abnormal condition, such as e.g. transmit a warning signal to the vehicle's driver.

According to some embodiments, the BSM 77 transmits a disconnect signal DS to the BDU control unit 86 that, in response to receiving the disconnect signal DS, controls the BDU elements, namely, the BDU relays 87 and the BDU fuses 88 to disconnect the system terminals 51, 52 from the module terminals 21, 22, respectively. According to some embodiments, the BDU control unit 86 controls the conductivity state of the BDU relays 87 to be non-conductive, separating the current paths from the module terminals 21, 22 to the system terminals 51, 52.

However, if one or more of the BDU relays 87 malfunctions, the BDU control unit 86 can detect, whether one of the BDU fuses 88 is blown in response to any eventual overcurrent of the battery module 20 and, if one or both of the BDU fuses 88 are blown, detect that the battery system 50 reached a safe state. In general, the BDU control unit 86 itself may be configured determine the presence of an abnormal condition in the battery disconnect unit 80 and perform or control to perform at least one countermeasure associated with the determined abnormal condition. The LV lines between the BSM 77 and the BDU control unit 86 and between the BDU control unit 86 and the BDU relays 87a, 87b and the BDU fuses 88a, 88b that are needed for sending and receiving the signals described above are presented in FIG. 3 with thin lines to illustrate the difference between HV lines and LV lines.

Figure 4A:
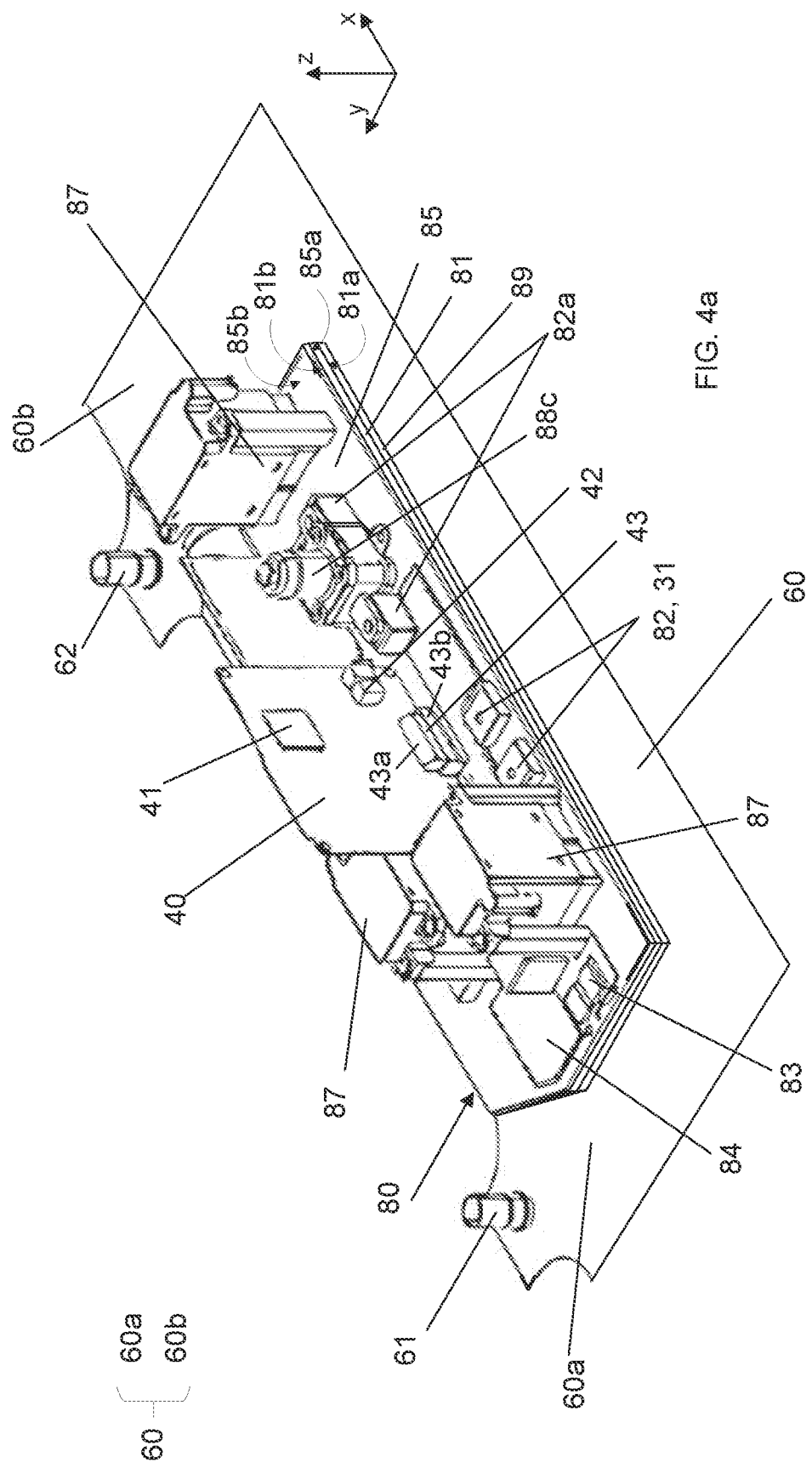
FIG. 4a illustrates a perspective view of a BDU according to some embodiments.
Figure 4B:
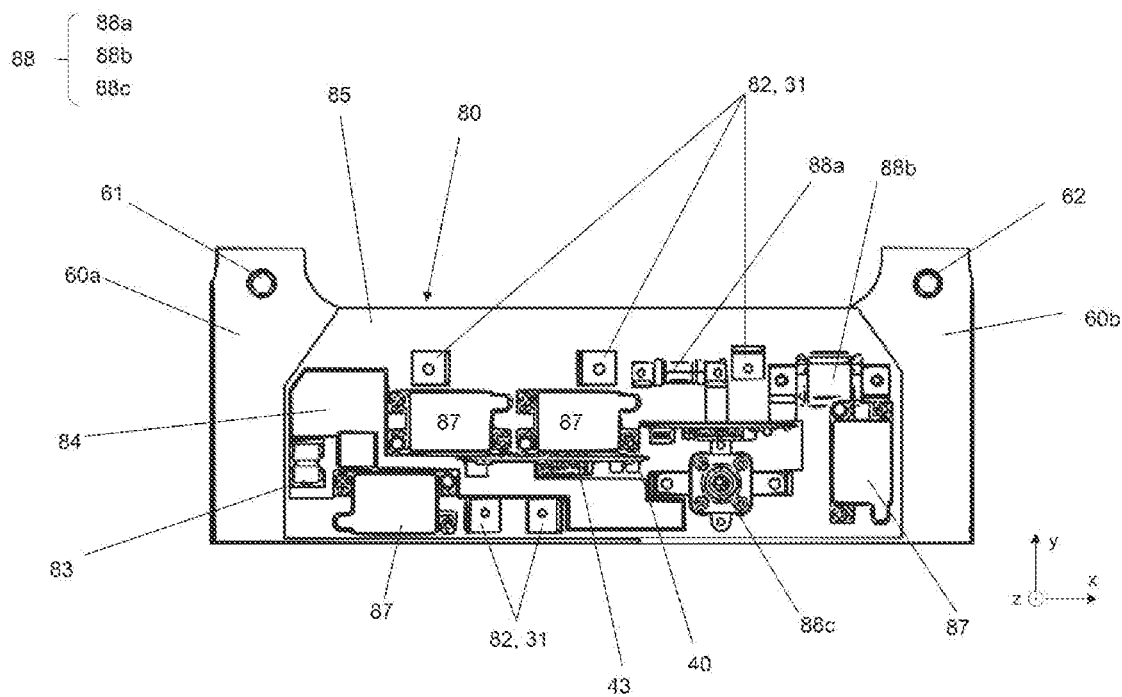
FIG. 4*b* illustrates a top view of the BDU shown in FIG. 4*a* according to some embodiments.

FIG. 4a and FIG. 4b both illustrate a BDU 80 according to some embodiments of the invention. FIG. 4a shows a perspective view of the BDU 80 while FIG. 4b shows a top view of the BDU 80.

A liquid cooling plate 60 is arranged on a first side 81a of the carrier plate 81. An electrically insulating thermal interface material layer 89, TIM, is arranged between the carrier plate 81 and the liquid cooling plate 60. A HV-PCB 85 is arranged on a second side 81b of the carrier plate 81, opposite to the first side 81a of the carrier plate 81. Some of the BDU components are at least partially integrated into the carrier plate 81 like the busbars 31 and are therefore only partially shown in FIG. 4. The HV-PCB 85 includes a conductive layer connected to the HV line 30. A shunt 83 and a pre-charge trace-resistor 84 are both part of the HV-PCB 85. The HV-PCB 85 further comprises second contacting means 43b configured for receiving first contacting means 43a of a LV-PCB 40. Both of the contacting means 43a, 43b are illustrated as parts of a PCB connector 43. The BDU busbars 31 are partially integrated in the carrier plate 81, a portion of each of the busbars being exposed, and forming busbar connection areas 82.

The further BDU components are arranged on a second side 85b of the HV-PCB 85 and the HV-PCB 85 is arranged on the second side 81b of the carrier plate 81 such that the first side 85a of the HV-PCB 85 is disposed on the second side 81b of the carrier plate 81, wherein the first side 85a of the HV-PCB 85 is opposite to the second side 85b of the HV-PCB 85.

Some of the HV BDU components like the BDU relays 87 and the BDU fuses 88a, 88b, 88c, are mounted onto mounting sockets 82a that are disposed adjacent busbar connection areas 82, establishing connections between two of the BDU busbars respectively and data connections to the LV-PCB 40 for measured sensor data of the HV BDU components. According to some embodiments of the present invention illustrated in FIG. 4 comprises three BDU fuses 88a, 88b, 88c, each of them connecting two of the BDU busbars. The BDU fuse 88c may be a pyrotechnic safety switch or pyrotechnic fuse (e.g., PYROFUSE®) and the BDU fuses 88a and 88b may be melting type fuses.

The LV components of the BDU 80 are installed on the LV-PCB 40 that is connected to the HV-PCB 85 via the PCB connector 43. The LV-PCB comprises LV electronics 42 of the BDU 80 and a CPU 41 of the BDU control unit 86. The LV components of the BDU 80 that are installed on the LV-PCB 40 comprise the BDU control unit 86 and the corresponding wiring as shown in FIG. 3.

The liquid cooling plate 60 form-fits on a first side 81a of the carrier plate 81. It comprises a cooling inlet 61 and a cooling outlet 62. The cooling liquid flows through a cavity of the liquid cooling plate 60, for example, through a plurality of flow channels inside the liquid cooling plate 60, from the cooling inlet 61 to the cooling outlet 62, cooling the carrier plate 81 with the integrated busbars 31a, 31b and the HV-PCB 85. This leads to a cold side 60a of the liquid cooling plate 60 on the side of the cooling inlet 61 and a hot side 60b of the liquid cooling plate 60 on the side of the cooling outlet 62.

The busbars 31a, 31b are electrically and thermally conducting, and hence the busbars 31a, 31b provide a thermal contact to the BDU components that are mounted on the second side 81b of the carrier plate 81, such that the BDU components upon the operation of the battery system 50, release heat energy and transfer the released heat energy to the busbars 31a, 31b by means of conduction.

The BDU components that are mounted on the second side 81b of the carrier plate 81 are being equally cooled as a result of this arrangement, especially the HV components like the BDU relays 87. As per requirements of the battery system 50 in an electric vehicle, a current is passed through the BDU relays 87. The BDU relays 87 have an internal resistance, as result of which heat is generated. Hence, during the operation of the battery system 50, especially, the BDU relays 87, release heat energy, as result of which the temperature of the battery system 50 gets increased. This would have an adverse effect on the performance of the battery system 50 as a whole. Hence, it is necessary to transfer the released heat by means of cooling.

Aspects of some embodiments of the present invention, as illustrated in FIG. 4, may enable a relatively efficient manufacture of the BDU 80, which also comprises a compact structure of the BDU 80. According to some embodiments, when some of the BDU components, for example the BDU fuses 88a, 88b, 88c need to be replaced, for it may be easily disconnected from the busbar connection areas and replaced. Also the LV-PCB may be easily replaced, for example in case of an update, due to the PCB connector 43.

The effects and characteristics of some embodiments of the present invention are not limited by the above-described contents, and more various effects are included in the present specification.

Although aspects of some embodiments of the present invention have been described, it is understood that the present invention should not be limited to these example embodiments but various changes and modifications can be made by one ordinary skilled in the art within the spirit and scope of the invention as hereinafter claimed.

Therefore, the technical scope of the present invention should not be limited to the contents described in the detailed description of the specification, but should be defined by the claims and their equivalents.

SUMMARY OF SOME OF THE REFERENCE SYMBOLS 2 battery case
3 cap assembly
4 cap plate
10 battery cell
11 positive terminal
12 negative terminal
13 injection hole
14 vent hole
15 notch
16 vent member
18 battery module busbars
20 battery module
21 first module terminal
22 second module terminal
23 heat exchange member
24 elastic member
25 support member
26 end plate
27 connection plate
28 fastening portion
29 bolt
30 HV line
30a first HV line
30b second HV line
30c first high current cable
30d second high current cable
31 BDU busbar
31a first BDU busbar
31b second BDU busbar
40 LV-PCB
41 CPU
42 LV BDU electronics
43 PCB connector
43a first contacting means
43b second contacting means
50 battery system
51 battery system terminal
52 battery system terminal
60 liquid cooling plate
60a liquid cooling plate (cold side)
60b liquid cooling plate (hot side)
61 cooling inlet
62 cooling outlet
70 housing
77 BSM
80 BDU
81 carrier plate
81a first side of the carrier plate
82 busbar connection area
83 shunt
84 pre-charge trace-resistor
85 HV-PCB
85b second side of the HV-PCB 86 BDU control unit
87 BDU relay
87a first BDU relay
87b second BDU relay
88 BDU fuse
88a first BDU fuse
88b second BDU fuse
88c pyrofuse
89 TIM

What is claimed is:

1. A battery system, comprising:
a housing;
a high voltage (HV) system located in the housing and having a plurality of connected rechargeable battery cells;
a battery disconnecting unit (BDU) located in the housing and adjacent to the rechargeable battery cells in a plan view such that the BDU is spaced apart from the rechargeable battery cells in the housing in the plan view, the BDU comprising a carrier plate having a first side, BDU relays configured to switchably open or close a HV line of the HV system, wherein the HV line is at least partially integrated into the carrier plate, and a BDU control unit configured to control the BDU relays; and
a liquid cooling plate between the housing and the BDU that is spaced apart from the rechargeable battery cells in the plan view and supported on a second side of the carrier plate opposite the first side of the carrier plate, wherein the liquid cooling plate comprises a cavity configured to conduct a cooling liquid at inside the liquid cooling plate.

2. The battery system of claim 1, wherein the second side of the carrier plate conforms to a shape of the liquid cooling plate.

3. The battery system of claim 1, further comprising a low voltage (LV) system having an operating voltage lower than an operating voltage of the HV system, wherein the BDU control unit is integrated with the LV system.

4. The battery system of claim 1, wherein the BDU further comprises HV components, including the BDU relays, and low-voltage (LV) components, including the BDU control unit and wherein the HV components and the LV components of the BDU are on a first side of the carrier plate that is opposite to the second side of the carrier plate.

5. The battery system of claim 1, wherein the HV line comprises a plurality of busbars that are at least partially integrated into the carrier plate.

6. The battery system of claim 5, wherein HV components of the BDU comprise a high voltage printed circuit board (HV-PCB) on the first side of the carrier plate that is opposite to the second side of the carrier plate, including a conductive layer connected to the HV line, and the BDU further comprises low-voltage (LV) components comprising a low voltage printed circuit board (LV-PCB), wherein the HV components and the LV components of the BDU are on the HV-PCB.

7. The battery system of claim 6, wherein the HV-PCB comprises a pre-charge trace resistor and wherein the pre-charge trace resistor comprises a conductive trace.

8. The battery system of claim 6, wherein the HV-PCB further comprises a shunt.

9. The battery system of claim 6, wherein the LV-PCB comprises a first contacting component and wherein the HV-PCB comprises a second contacting component configured for receiving the first contacting component for establishing a data connection between the LV-PCB and the HV-PCB.

10. The battery system of claim 6, wherein the HV-PCB comprises a plurality of busbar connection areas each exposing a portion of one of the plurality of busbars.

11. The battery system of claim 6, wherein BDU components of the battery system comprise at least one pyrotechnic safety switch, at least one relay, and/or at least one melting fuse.

12. The battery system of claim 10, wherein at least one relay and/or fuse is connecting two busbar connection areas to each other.

13. The battery system of claim 9, wherein the HV-PCB further comprises a plurality of data lines connecting the second contacting component and at least one mounting socket formed on the first side of the carrier plate.

14. The battery system of claim 6, wherein the BDU comprises a thermally conducting and electrically isolating interface material layer (TIM) between the liquid cooling plate and the carrier plate and/or between the carrier plate and the HV-PCB.

15. An electric vehicle including the battery system of claim 1.

16. The battery system of claim 1, further comprising a plurality of fuses connected in series with corresponding ones of the BDU relays, and in electrical communication with the BDU, wherein the BDU is configured to identify a malfunction of one or more of the BDU relays and a corresponding one of the fuses is blown.

* * * * *